(12) United States Patent
Eidelman

(10) Patent No.: US 6,787,194 B2
(45) Date of Patent: Sep. 7, 2004

(54) METHOD AND APPARATUS FOR PULSED DETONATION COATING OF INTERNAL SURFACES OF SMALL DIAMETER TUBES AND THE LIKE

(75) Inventor: Shmuel Eidelman, Rockville, MD (US)

(73) Assignee: Science Applications International Corporation, San Diego, CA (US)

( * ) Notice: Subject to any disclaimer, the term of this patent is extended or adjusted under 35 U.S.C. 154(b) by 92 days.

(21) Appl. No.: 10/123,522

(22) Filed: Apr. 17, 2002

(65) Prior Publication Data

US 2003/0196600 A1 Oct. 23, 2003

(51) Int. Cl.⁷ .............................. C23C 4/12; B05C 5/04
(52) U.S. Cl. .................... 427/447; 427/450; 427/452; 427/453; 427/455; 427/456; 239/79
(58) Field of Search ................................ 427/447, 450, 427/452, 453, 455, 456; 239/79

(56) References Cited

U.S. PATENT DOCUMENTS

| | | | |
|---|---|---|---|
| 2,714,563 A | | 8/1955 | Poorman et al. |
| 3,954,380 A | | 5/1976 | Valaev et al. |
| 4,004,735 A | | 1/1977 | Zverev et al. |
| 4,669,658 A | | 6/1987 | Nevgod et al. |
| 4,781,145 A | * | 11/1988 | Amlinsky et al. .......... 118/620 |
| 5,075,129 A | | 12/1991 | Jackson et al. |
| 5,123,835 A | | 6/1992 | Richards et al. |
| 5,542,606 A | | 8/1996 | Kadyrov et al. |
| 5,855,827 A | * | 1/1999 | Bussing et al. ................. 264/7 |
| 6,025,034 A | * | 2/2000 | Strutt et al. ................. 427/450 |
| 6,630,207 B1 | * | 10/2003 | Eidelman ..................... 427/447 |

FOREIGN PATENT DOCUMENTS

GB   2 117 007 A   * 10/1983
JP   02-099155    *  4/1990

OTHER PUBLICATIONS

Metals Hanbook, Ninth Edition, vol. 5: "Surface Cleaning, Finishing, and Coating", American Society of Metals, 1982, p. 364.*

G. B. Fagoaa et al., The High Frequency Pulse Detonation (HFPD) Spray Process, Aerostar Coatings. Fundacion INASMET (Irun–Spain) 1996, no month date.

G. B. Fagoaga et al., High Frequency Pulse Detonation (HFPD): Processing Parameters. Aerostar Coatings, Fundacion INASMET (Irun–Spain) 1997, no month date.

* cited by examiner

Primary Examiner—Katherine A. Bareford
(74) Attorney, Agent, or Firm—Banner & Witcoff, Ltd.

(57) ABSTRACT

A pulsed detonation gun comprises a small-diameter detonation tube, an igniter, and an outlet for discharging detonation products containing a coating material. A detonable or reactive mixture containing a coating precursor is formed in the detonation tube, and the detonable or reactive mixture is ignited to produce detonation or reaction products containing the coating precursor or a coating material formed in situ during a detonation process or a deflagration process. The coating material is discharged through the outlet and is contacted with the substrate to produce a coating. The device is particularly useful for coating the inside surfaces of small-diameter tubes and a variety of other difficult-to-reach substrate surfaces.

46 Claims, 4 Drawing Sheets

METHOD AND APPARATUS FOR PULSED DETONATION COATING OF INTERNAL SURFACES OF SMALL DIAMETER TUBES AND THE LIKE

STATEMENT OF FEDERALLY SPONSORED RESEARCH

This invention was made pursuant to Contract No. N00014-01-C-0033, awarded by the Office of Naval Research, and therefore the U.S. Government may have certain rights in the invention.

FIELD OF THE INVENTION

The present invention is directed to coating technology and, more particularly, to pulsed detonation coating.

DESCRIPTION OF RELATED ART

Several techniques have been used to implement thermal spray coating. One approach has been High Velocity Oxygen/Fuel System (HVOF), in which solid particles are injected in high velocity gas produced by reaction of oxidizer and a fuel at high pressure. Such systems typically are used for deposition at atmospheric pressure and primarily are used for coating metal alloys and WC/Co powders with particle sizes larger than about $10\mu$. Other thermal spray coating techniques include plasma spray, in which particles are heated and accelerated by high temperature plasma produced by an electric discharge in an inert gas atmosphere. Plasma spray systems have been used for both atmospheric- and low-pressure coatings.

Thermal spray coating also has been implemented by intermittent detonations, e.g., by the use of a detonation gun (D-Gun). D-guns can be used for coating a wide variety of materials, such as metals, cermets, and ceramics. D-guns typically have a relatively long (often about 1 m), fluid-cooled barrel having an inner diameter of about one inch. Typically, a mixture of reactive gases, such as oxidizer and acetylene, is fed into the gun along with a comminuted coating material in two phases. The reactive gas mixture is ignited to produce a detonation wave, which travels down the barrel of the gun. The detonation wave heats and accelerates the coating material particles, which are propelled out of the gun onto a substrate to be coated.

The detonation wave typically propagates with a speed of about 2.5 km/sec in the tube and can accelerate the particle-laden detonation products to a velocity of about 2 km/sec. However, coating particles never reach the velocity of detonation products due to inertia. In practice, particle velocities usually are lower than about 900 m/sec. The temperature of the detonation products often reaches about 4000 K. After the coating material exits the barrel of the D-gun, a pulse of nitrogen typically is used to purge the barrel. Newer designs of the D-guns allow operation frequencies of up to about 100 Hz. See, e.g., I. Fagoaga et al., "High Frequency Pulsed Detonation (HFPD): Processing Parameters" (1997).

One example of a gas detonation coating apparatus is illustrated in U.S. Pat. No. 4,669,658 to Nevgod et al. A barrel enclosed in a casing has annular grooves made on an inner surface of an initial portion thereof. A main pipe housing a spark plug and having annular grooves on its inner surface is inserted into the initial portion of the barrel. In operation, a gas supply means is turned on. The apparatus works in cycles, each cycle accompanied by gas flowing into the barrel and the main pipe through tubes, gas conduits, and additional pipes. After the gases fill the barrel, the gas mixture is ignited in each cycle with the aid of the spark plug. The detonation products are said to quickly heat up the walls of the barrel and the annular grooves.

According to Nevgod, the gases flowing into the barrel are heated up in two stages. During the first stage the gases are warmed up in the additional pipes heated up in cycles by the detonation products. The heat insulation tubes are said to prevent the pipes from cooling down. During the second stage, the gases are heated up in the barrel and partially in the main pipe. The annular grooves on the inner cylindrical surface of the initial portion of the barrel, the inner surface of the main pipe and on the inner surface of the cover on the end of the barrel, are said to enhance the efficiency of heat exchange with the gases due to an increase in the heat exchange area and due to gas turbulization. The gases are heated to a temperature approximating that of self-ignition. A plurality of ignition sites is provided to accelerate the burning process.

Presently available detonation coating devices suffer from several drawbacks. One major drawback is that the devices are implemented at a scale that makes coating of internal surfaces and difficult-to-reach spaces difficult, if not impossible. For example, present D-guns are unsuitable for coating the internal surface of tubes having an internal diameter smaller than about 10 cm. One HVOF system recently was modified to enable coating inside of a cylinder borehole of an engine block. This was done to permit coating of metallic materials over ceramic surfaces of the cylinder bores. However, because of the size limitations inherent to HVOF systems (e.g., the need for a cooling jacket, the relatively large nozzle diameter, the large size combustion chamber and the bulky gas feed lines), this technology is unsuitable for coating the inside surfaces of long, small-diameter tubes. In addition, large particles used in HVOF systems need substantial distances to achieve the velocities and temperatures needed for producing coatings having an acceptable quality.

There remains a need for technology for coating difficult-to-reach surfaces, particularly for applying coatings that provide protection against corrosion, erosion, and wear. It would be desirable to develop thermal spray coating technology that enables the use of a miniaturized coating apparatus, especially one that can be adapted for coating difficult-to-reach surfaces, especially the inside surfaces of small-diameter tubes, the inner surfaces of cylinders, the inner surfaces of converging/diverging shapes, the inner surfaces of small rectangular tubes, the inner surfaces of shapes that are partially open, and the inner surfaces of various other non-cylindrical shapes.

SUMMARY OF THE INVENTION

The present invention is directed to a method and apparatus for producing a coating on a substrate using a pulsed detonation gun. According to one embodiment, a pulsed detonation gun comprises a small-diameter detonation tube, an igniter, and an outlet for discharging detonation products. A detonable mixture containing a coating precursor is formed in the detonation tube, and the detonable mixture is ignited to produce detonation products containing the coating precursor. The coating precursor is discharged through the nozzle and is contacted with the substrate to produce a coating.

In another embodiment, a coating material is produced in situ by reaction of a coating precursor in a detonable or reactive mixture. The coating precursor is intermittently injected into the detonation tube together with other component(s) (e.g., fuel and oxidizer) to form a detonable or reactive mixture. The detonable or reactive mixture is ignited to produce high-temperature detonation or reaction products, e.g., during a detonation process or a deflagration process. The detonation or reaction products heat and accelerate the coating material through the detonation tube and toward the surface to be coated.

The pulsed detonation gun of the present invention is particularly useful for directly depositing coating material(s) over internal surfaces of tubes and other hard-to-reach surfaces of a substrate, such as the inner surfaces of cylinders, the inner surfaces of converging/diverging shapes, the inner surfaces of rectangular tubes, the inner surfaces of shapes that are partially open, and the inner surfaces of various other non-cylindrical shapes.

The material(s) are deposited by high velocity gas products produced in intermittent detonations or an intermittent injection and deflagration process. The detonation tube and its associated fuel/oxidizer supply lines can be constructed at a sufficiently small scale that allows their insertion into long, small-diameter tubes, and permits their use in coating various other difficult-to-reach surfaces. Of course, the apparatus of the present invention also is useful for coating a wide variety of large-diameter tubes, such as gun barrels, tubes used in oil industries, tubes used in food industries, etc.

The detonation products produced by the pulsed detonation gun accelerate and heat the coating precursor or coating material particles to high kinetic energies, resulting in high quality coating depositions that can provide such properties as corrosion-, erosion-, and wear resistance. Existing thermal spray coating equipment is unsuitable for applying such coatings to the inner surfaces of small-diameter tubes and many other difficult-to-reach surfaces.

The pulsed detonation coating device of the present invention avoids the need for forced water- or air-cooling because the internal volume of the device is exposed to the relatively cold injected gases between the occurrences of detonations, which are characterized by very short periods of high pressure and temperature conditions. The device can be operated with a relatively low gas line pressure and does not require a separate combustion chamber. These factors each contribute to the ability of constructing the device at scale substantially smaller than is possible with presently available technologies.

According to another embodiment of the present invention, a method for producing a coating on a substrate comprises providing a pulsed detonation gun comprising a detonation chamber, an igniter, and an outlet for discharging detonation products. A coating precursor is mixed with fuel or oxidizer, such as by forming a suspension of coating precursor particles in fuel or oxidizer, prior to injection into the detonation chamber. The detonable mixture is ignited to produce detonation products containing the coating precursor. The coating precursor is contacted with the substrate to produce a coating on the substrate.

BRIEF DESCRIPTION OF THE DRAWINGS

The present invention will now be described in more detail with reference to preferred embodiments of the invention, given only by way of example, and illustrated in the accompanying drawings in which:

FIGS. 3A and 3B show alternate showerhead configurations; FIGS. 3C and 3D illustrate nozzles that are displaceable to a plurality of coating positions.

DETAILED DESCRIPTION OF THE INVENTION

Figure 1A:
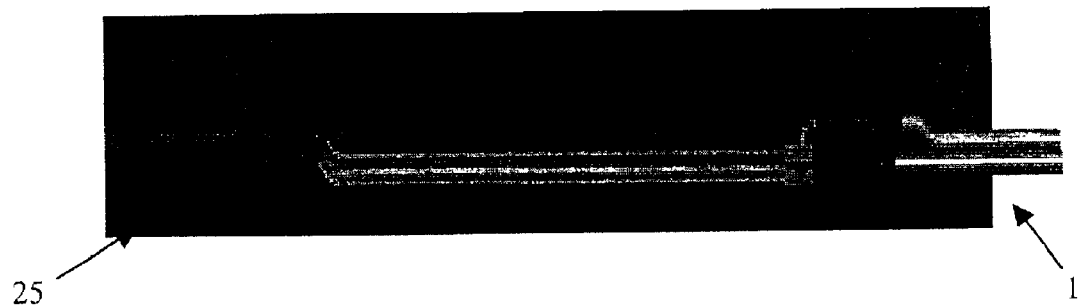
FIG. 1A is a three-dimensional model of the cross section of a pulsed detonation coating apparatus, shown inside a small-diameter tube, in accordance with a preferred embodiment of the present invention.

The pulsed detonation coating apparatus of the present invention has utility in applying a wide variety of coating materials to a wide variety of substrates and is particularly useful in coating the inside surfaces of small-diameter tubes and other difficult-to-reach surfaces, such as the inner surfaces of cylinders, the inner surfaces of converging/diverging shapes, the inner surfaces of small rectangular tubes, the inner surfaces of shapes that are partially open, and the inner surfaces of various other non-cylindrical shapes, to improve such properties as corrosion-, erosion-, and wear resistance. Nanoscale ceramic particles can be used, for example, for coating lightweight, low melting point metals used in aircraft structures to impart erosion- and corrosion resistance. Coatings of polytetrafluoroethylene, polymers, and other plastic materials can be applied to the inside surfaces tubes, for example, for corrosion protection and to improve lubricity and other tribological properties of the inner surfaces of the tubes. Metal and metal composite materials, such us Al/SiC, can be coated on the inner surfaces of cylinders of internal combustion engines. As another example, corrosion/erosion protective materials such as alumina/titania, Cr, WC/Co, Ni and Cr based alloys, and other similar materials can be applied to tubes/pipes used in geothermal energy exploration, which often are subjected to high-temperature corrosive environments. Similar coatings may be applied to tubes/pipes that are used to transport corrosive/erosive liquid, gases, and suspensions used in oil exploration, chemicals industry, and energy generation and energy delivery industries. Thermal barrier coatings based on zirconia, alumina, and similar materials can be applied to metal tubes for protection from very high temperature gas or liquid flow and for reduction of thermal losses.

The term "detonation," "detonation process," and similar terms are used herein refer to a physical phenomena characterized by a shock wave propagating in front of a reaction front. The shock wave compresses the initial mixture to high pressures and high temperatures so as to initiate a very high initial rate of reaction behind its front. The detonation front propagates with supersonic speeds, typically on the order of about 1000 to 3000 m/sec.

The term "deflagration process," as used herein, refers to a combustion process in which a reaction front propagates slowly through the mixture via diffusion and thermal initiation. Combustion of the unconfined mixture does not yield the high pressures that are characteristic of detonation. The combustion front propagates with subsonic speeds, typically on the order of about 1 to 30 m/sec.

The term "detonable mixture," as used herein, refers to the components present in the detonation tube at the time of detonation. One example of a detonable mixture is oxygen, a fuel detonable in mixtures with oxygen, and a coating precursor. Another example of a detonable mixture is a monopropellant, such as nitromethane or nitrobenzene, and a coating precursor. As another example, a detonable mixture can comprise a detonable coating precursor and an oxidizer. The term "reactive mixture" refers to the components present m the detonation tube at the time of a deflagration process.

The term "coating precursor," as used herein, refers to (1) material that can be heated and accelerated in a detonation process to form a coating, or (2) material that can react during a detonation process or a deflagration process to form a coating material in situ. The coating precursor can comprise, by way of example, particles such as metals, cements, ceramics, polymers, or combinations thereof. The term "detonable coating precursor," as used herein, refers to materials which function as both a coating precursor and as a fuel. Non-limiting examples of detonable coating precursors include gaseous and liquid metalorganic compounds, such as silane, disilane, germane, tungsten hexaflurade, trimethylboron, cadmium acetate, magnesium ethoxide, tantalum V-methoxide, tungsten V-ethoxide, zinc naphenate, and zirconium The coating precursor may be in a variety of physical forms. For example, the coating precursor may comprise metal particles, which can be pre-mixed with the fuel or oxidizer before injection into the detonation tube. During the detonation process, the coating precursor particles are heated and are liquefied or semi-liquefied. The resulting detonation products act as a carrier for the liquefied or semi-liquefied coating precursor, which forms a coating on the substrate. The coating precursor alternatively can be in the gaseous phase, and may form coatings, for example, upon interaction with the substrate via chemical reaction, physical sintering, or both.

Examples of fuels that can be used include, but are not limited to, those detonable in mixtures with oxidizer such as hydrogen, methane, propane, acetylene, or propylene. Also, detonable mixtures of liquid fuels and oxidizer can be used, e.g., kerosene/oxygen, alcohol/oxygen, benzene/oxygen and other similar mixtures. In addition, some detonable monopropellants can be used, such as nitromethane, nitroglycerin, or similar single-component fuels that can be detonated. Selection of a suitable fuel will be apparent to persons skilled in the art and forms no part of the present invention.

Non-limiting examples of oxidizers include oxygen, air, mixtures of oxygen and nitrogen, mixtures of oxygen and one or more inert gases such as helium and argon. The relative amounts of nitrogen or inert gases vary over a wide range and can be suitably selected by persons skilled in the art with the aid of no more than routine experimentation.

For solid coating precursors, the size of the particles can vary over a wide range. Often the mean particle size is about $50\mu$ or less. Smaller micron particle sizes also can be used, such as those having a mean particle size of less than about $20\mu$ or $10\mu$. In one embodiment of the invention, sub-micron sized particles can be used, having a mean particle size of less than $1\mu$, and can have a mean particle size as small as about 100 nm, 10 nm, or less. The coating precursor typically is supplied in an inert liquid or gaseous carrier, such as water, nitrogen, argon, or helium.

Figure 1B:
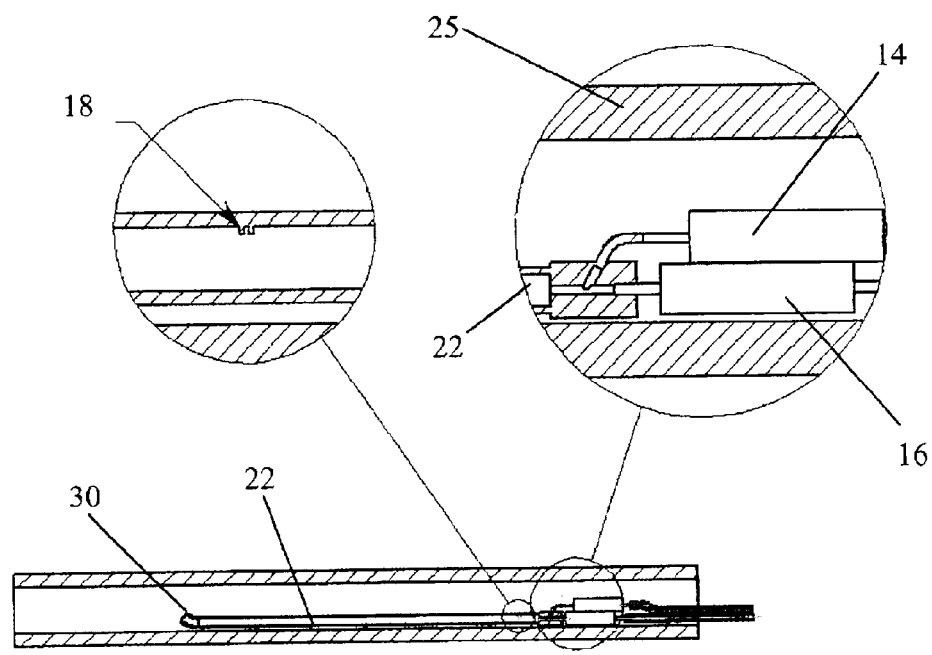
FIG. 1B is a schematic illustration of the cross section of the pulsed detonation coating apparatus shown in FIG. 1A.

A preferred embodiment of the present invention is illustrated in FIGS. 1A and 1B. FIG. 1A is a three-dimensional model illustrating a pulsed detonation coating apparatus (1) inside of a small-diameter tube (25), e.g., having a diameter of about 2 cm. FIG. 1B illustrates a cross-sectional view of the apparatus of FIG. 1A, including a blown-up view of a portion of the coating apparatus (1) inside the small-diameter tube (25). The apparatus (1) includes a small-diameter detonation tube (22) for receiving a detonable mixture containing a coating precursor, and a detonation tube outlet (30) for discharging detonation products. The detonation tube (22) preferably has a sufficiently small diameter to enable the apparatus (1) to easily fit into small-diameter tubes, e.g., tubes having a diameter of about 10 cm, 5 cm, 2 cm or even less. The detonation tube (22) most often has a diameter of about 20 mm or less, more usually about 5 mm or less. In one preferred embodiment, the detonation tube (22) has a diameter of less than about 2 mm. The detonation tube is described herein with reference to cylindrical shapes. However, it should be understood that the geometry of the detonation tube is not limited to cylindrical shapes; for example, the detonation tube may have a rectangular cross-section. In the context of non-cylindrical tubes, the term "diameter" refers to the diameter of a circle having the same area as the cross-sectional area of the non-cylindrical tube, or in the case of tubes having non-uniform cross-sections, the maximum cross-sectional area of the tube.

A first injector (14) feeds oxidizer into the detonation tube (22). A second injector (16) feeds fuel into the detonation tube (22). The oxidizer (14) and fuel (16) injectors each have miniature valves for controlling the flow of oxidizer and fuel, respectively. The coating precursor typically is co-injected together with fuel and oxidizer into detonation tube (22) to form a detonable mixture. In a preferred embodiment, the coating precursor is pre-mixed with the oxidizer or fuel prior to injection. In some cases it may be possible to co-inject the coating precursor into the detonation tube (22) via a separate inlet (not illustrated). Normally, the components of the detonable mixture (e.g., oxidizer, fuel, and coating precursor) are simultaneously co-injected at predetermined intervals. It is also possible to co-inject the components of the detonable mixture sequentially, if desired.

A suspension of the coating precursor and fuel can be formed and injected into the detonation tube (22). The suspension can be mixed with an oxidizer in the detonation tube (22) to form a detonable mixture. If the fuel is a monopropellant, the suspension can be injected, dispersed, and ignited, e.g., the suspension itself can form the detonable mixture. This embodiment is particularly advantageous for the direct processing of nanoscale particles into coatings. The suspension provides for easy injection and uniform dispersion of the coating particles and avoids such problems as clogging of the particle injection line, e.g., resulting from particle agglomeration. Smaller particles also tend to be more reactive and thus difficult to handle. For example, sub-micron particles of Cu and Ti can self-ignite in air. Mixing the particles with fuel isolates the particles from atmospheric oxygen, reducing handling hazards.

Optionally, two or more coating precursors can be alternatively injected into the detonation tube (22). The changing from one coating precursor to another coating precursor can be done at predetermined intervals (e.g., alternating each detonation, every other detonation, every fifth detonation, etc.) or can be actuated manually by an operator. Multiple coating precursors may be used, for example, to create a complex multi-layered coating material on a substrate using a single coating apparatus.

The detonable mixture is ignited by suitable igniter, such as a spark plug, laser, pyrotechnic device, or the like. FIG. 1B illustrates spark plug electrodes (18) located on the inner wall of the detonation tube (22). Each detonation creates a detonation wave that propagates through the detonation tube (22). The resulting high-temperature and high-pressure detonation products heat the coating precursor particles and accelerate the particles through the detonation tube (22). The coating precursor particles are discharged through the detonation tube outlet (30) and toward the inside surface of the small-diameter tube (25) or other substrate to be coated. The frequency of detonations can vary over a wide range and can be suitably selected to meet the needs of a particular application, as will be apparent to persons skilled in the art. The operating frequency most often ranges from about 0.1 to 1,000 Hz.

The intermittent operation of the pulsed detonation coating apparatus (1) avoids the need for separate cooling equipment because intermittent injection of the relatively cold gases between the brief periods of high-temperature detonation enables relatively low temperatures to be maintained in the detonation tube walls (22). Nevertheless, to prevent damage to valves and other system elements, in some cases it may be advantageous to blow air or inert gas through the inner volume of the detonation tube over the valves and other elements of pulsed detonation coating apparatus (1), or to provide cooling in some other fashion.

In an alternative embodiment of the present invention, a coating material is synthesized in situ during an intermittent detonation or deflagration process. A coating precursor is pre-mixed with oxidizer or fuel, and the components are co-injected into the detonation tube (22) to form a detonable or reactive mixture. A detonable coating precursor also may be used, can be co-injected with an oxidizer as in the previous embodiment. When the detonable or reactive mixture is ignited, the coating precursor reacts in the high-temperature detonation or reaction products to yield coating materials that are accelerated through the detonation tube (22), through the detonation tube outlet (30), and toward the inner surface of the small-diameter tube (25) or other surface to be coated.

Figure 2:
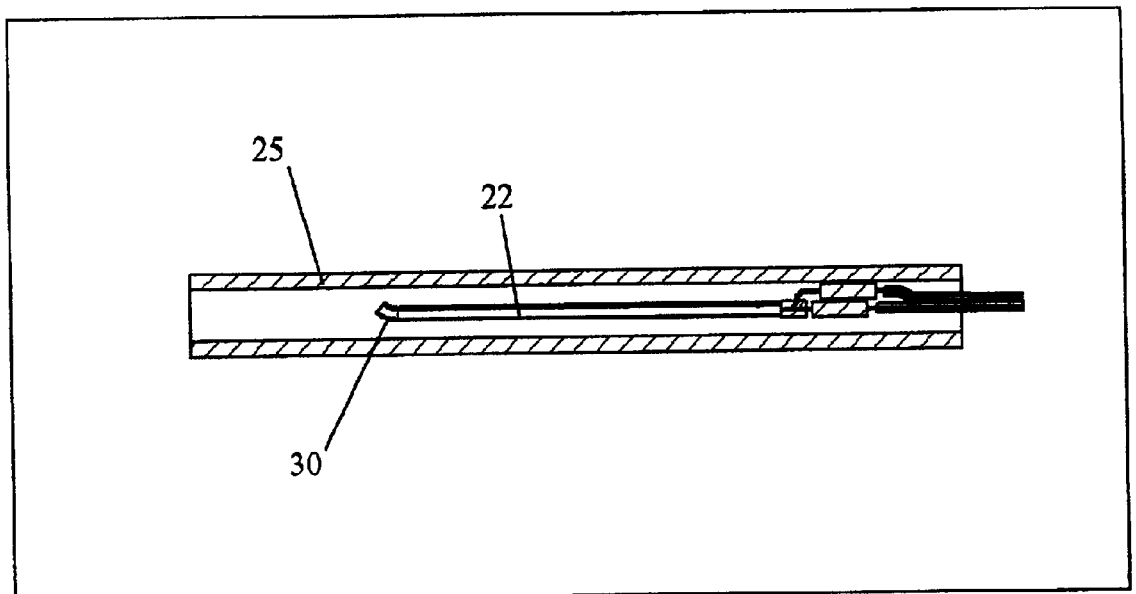
FIG. 2 is a schematic illustration of a pulsed detonation coating apparatus operated in a low pressure or vacuum chamber in accordance with an alternative embodiment of the present invention.

As illustrated in FIG. 2, the coating process can be implemented in a vacuum or reduced pressure environment. The lower pressures are particularly useful for coating with small particles and nanosized particles. For example, the small-diameter tube (25) or other substrate to be coated can be situated in a low-pressure or vacuum chamber (40). The valves, controls, etc. preferably are disposed outside of the vacuum chamber (40) for easy operator access, while the fuel, oxidizer, inert gas/precursor materials, and ignition lines are fed through the wall of the low-pressure or vacuum chamber (40) without interfering with the vacuum or low-pressure environment. Any suitable low-pressure or vacuum means can be used for maintaining low-pressure or vacuum within the low-pressure chamber. The term "low pressure" refers to pressures lower than atmospheric (less than 1 atmosphere) and typically on the order of $10^{-1}$ of atmospheres and lower, often on the order of $10^{-2}$ to $10^{-3}$ atmospheres and lower. The term "vacuum" refers to pressures of $10^{-6}$ atmospheres and lower.

The low pressure environment provides a greater pressure gradient in relation to the detonation pressure, which imparts increased kinetic energy and impact energy to the coating particles, resulting in high quality coatings. The detonation products expand from the high-pressure, high-temperature environment of the detonation tube (22) to the low-pressure environment of the low-pressure or vacuum chamber (40). By maintaining low pressure near the substrate (25), it is possible to produce high quality coatings using small-micron scale and even nanoscale-sized particles. The particles are effectively accelerated in the expanding detonation products and do not appreciably decelerate at the substrate because of the very small drag force in the low-density and low-pressure environment. In general, the drag force is smaller for smaller particles. In the low-pressure environment, the characteristic size of smaller (e.g., nanoscale) particles approaches that of the collision free path for molecules of the low-pressure carrying gas. Thus, small-micron size particles generally require lower pressures than do smaller, nanoscale particles for the same drag force at the substrate environment.

In the low-pressure or vacuum chamber (40), the coating precursor particles are accelerated to high velocities. The particle velocities can vary over a wide range depending on such factors as particle size, detonation pressure, detonation temperature, and the pressure in the low-pressure chamber. Typical particle velocities are in excess of about 2 km/sec., often 3 km/sec., 4 km/sec., 5 km/sec., or even higher. Because the high temperature detonation products heat the coating precursor particles, the coating particles generally are in a liquefied or semi-liquefied state.

The low-pressure environment also effectively removes or reduces the amount of carrier gases from the detonation products as the detonation products are accelerated toward the substrate (25), resulting in relatively low pressure at the substrate surface. This is especially significant for coatings using small-micron and nanosized particles, which are particularly susceptible to being decelerated and diverted away from the substrate by turbulent gas flow in the vicinity of the substrate surface. Such a problem is encountered, for example, in conventional HVOF coating A spark plug (18) or other suitable igniter is provided to ignite the fuel in the detonation tube (22), producing detonation products containing the coating precursor. The detonation reaction produces a brief period of extremely high temperature and high pressure inside the detonation tube (22). Typical detonation temperatures are on the order of 4000 K, and pressures on the order of 20–30 atmospheres and higher. The period of each detonation most often is less than about $10^{-3}$ sec. and can be as small as about $10^{-4}$ sec., $10^{-5}$ sec., or even less. Shorter periods of detonation can reduce or avoid appreciable local heating of the substrate, and also can permit operation at high frequencies, e.g., as high as 1000 Hz or higher. Shorter periods of detonation also can help avoid or reduce particle grain growth, particularly with nanosized particles.

The detonation tube outlet (30) preferably includes configured openings and/or a nozzle for directing the detonation products toward the substrate (25) to produce a coating. A wide variety of configurations are possible and may be particularly adapted for coating the inside surfaces of the small-diameter tubes (25) and various other difficult-to-reach portions of substrates, such as the inner surfaces of cylinders, the inner surfaces of converging/diverging shapes, the inner surfaces of small rectangular tubes, the inner surfaces of shapes that are partially open, and the inner surfaces of various other non-cylindrical shapes. Several examples of showerhead and nozzle configurations are illustrated in FIGS. 3A–3E. Other configurations may be suitably selected for coating particular substrates and should be considered to fall within the scope of the present invention.

Figure 3A:
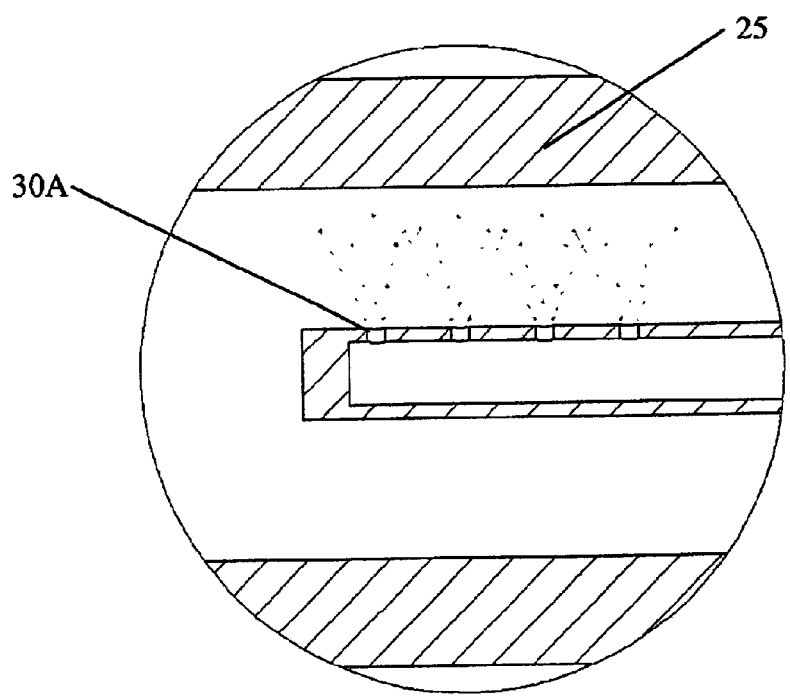
FIGS. 3A–3E illustrate several variations for the detonation tube outlet.
Figure 3B:
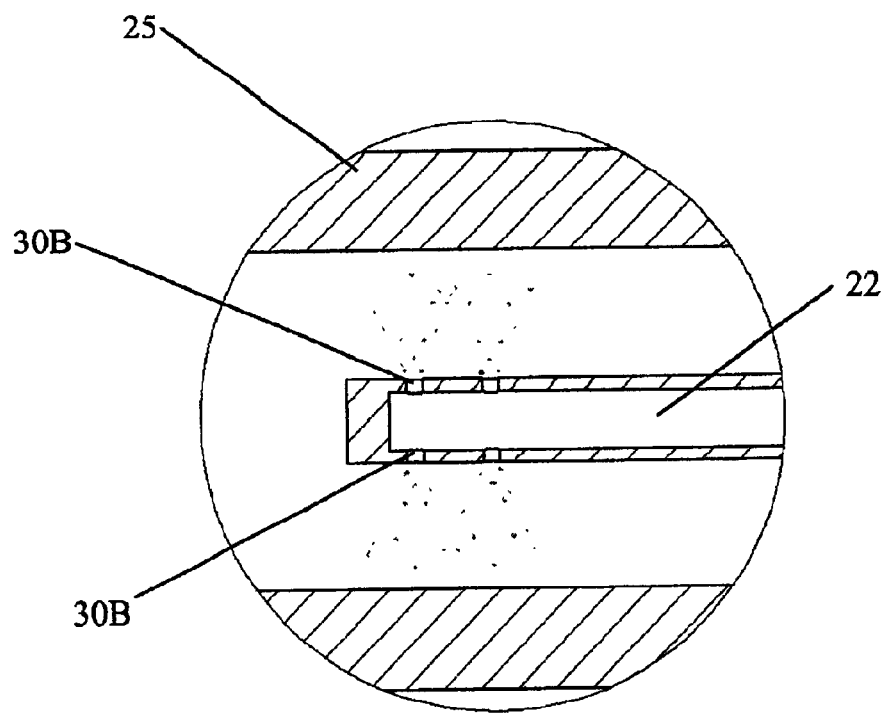

The detonation tube outlet (30) may include a plurality of openings, such as in a "showerhead" type configuration, as illustrated in FIGS. 3A and 3B. FIG. 3A illustrates a plurality of openings (30A) located along one side of the detonation tube (22). The apparatus, when placed inside the center of a tube, can coat the inner surfaces of the tube (25) that is opposite to the openings (30A), as illustrated in FIG. 3A.

Alternatively, as illustrated in FIG. 3B, a number of openings (30B) may be provided at positions along the circumference of the detonation tube (22) to simultaneously coat the entire adjacent inner circumference of the tube (25).

Figure 3C:
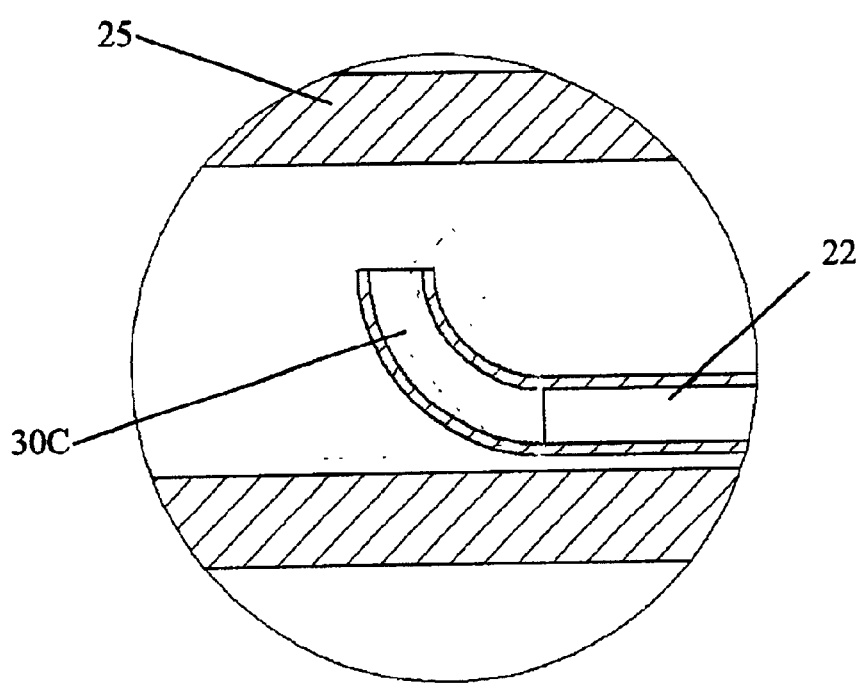
Figure 3D:
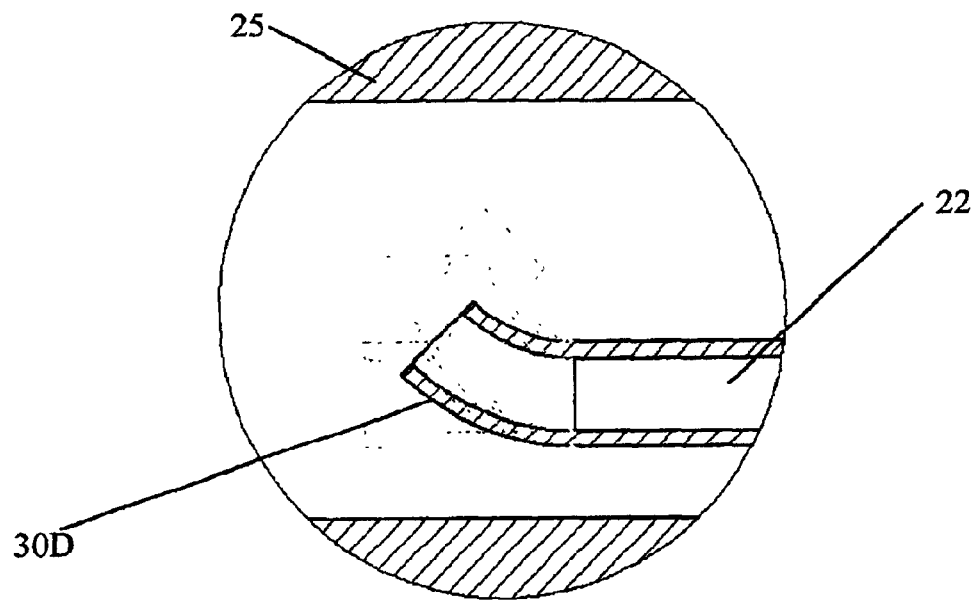

As illustrated in FIGS. 3C and 3D, the detonation tube outlet (30) may include a flexible nozzle (30C, 30D) that can be bent and displaced to a plurality of coating positions, as shown in the solid and phantom lines in FIGS. 3C and 3D. The small diameter of the detonation tube (22) enables a suitable flexible nozzle (30C, 30D) to be more easily constructed than would be the case for a larger diameter nozzle. Alternatively, a fixed nozzle may be employed. The fixed nozzle can be oriented at a predetermined angle best suited for coating a particular substrate surface. Any suitable angle may be selected for the nozzle orientation, e.g., 0 to 45°, 45 to 90°, or 90 to 135° relative to the axis of the detonation tube (22).

Figure 3E:
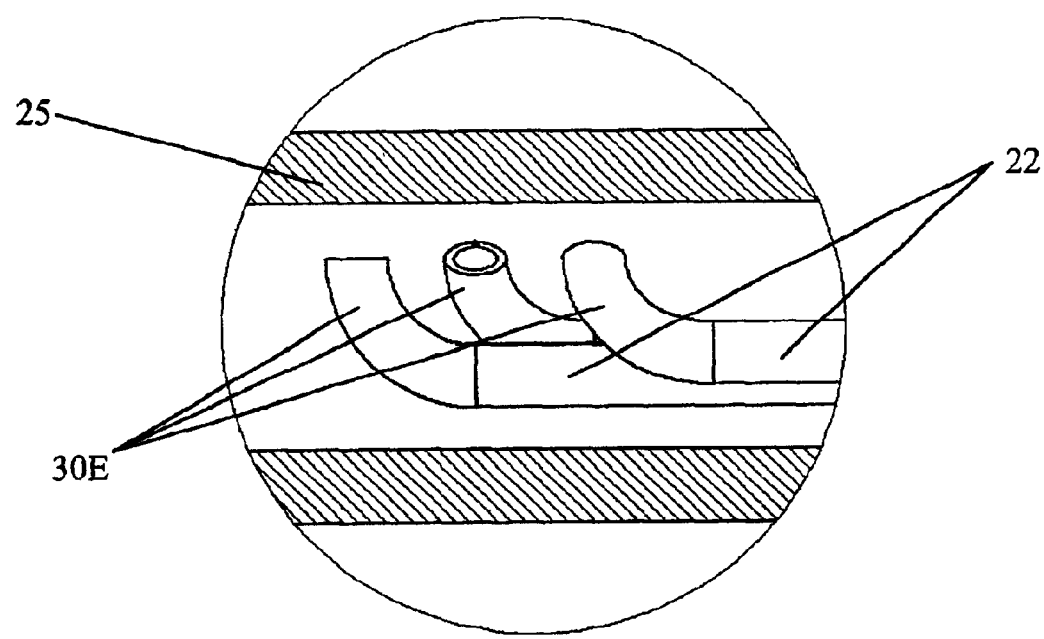

FIG. 3E illustrates an alternative embodiment in which a device includes a plurality of pulsed detonation guns (1), each of which has a structure as previously described. FIG. 3E illustrates three detonation guns, each having a detonation tube (22) and a nozzle (30E) oriented at different predetermined angle. While three guns are illustrated in FIG. 3E, it is contemplated that a multi-gun device may include two, four, or possibly even more guns. Because the coating can be simultaneously applied at different angles by virtue of the plural guns, fixed-angle nozzles are preferred in this embodiment. However, it also is contemplated that flexible nozzles may be used.

The pulsed detonation coating apparatus (1) of the present invention can be constructed substantially smaller than conventional D-guns, permitting its use for coating the inside surface of small-diameter tubes (25) and various other difficult-to-reach substrate surfaces. The total length of the pulsed detonation coating apparatus (1) preferably is about 50 cm or less. It is contemplated that coating guns (1) of the present invention can have a total length of about 5 cm or even less.

The intermittent detonations advantageously enable the surface of the substrate (25) to cool between coated layers. This enables high deposition rates of coating materials, such as metals or ceramics, onto a wide variety of substrates, especially those, such as plastic, that have low melting point surfaces. If necessary, the surface of the substrate (25) can be subjected to rapid temperature quenching, for example after each detonation exposure or at other suitable intervals. This can be done, for example, by intermittently spraying nitrogen onto the substrate surface between exposures. Quenching can be also achieved by injecting liquids such as water, ethyl alcohol, or inert gases such as helium or argon between the cycles into the detonation tube (22).

At particle velocities in excess of 2 km/sec., some particles will fuse into coatings, even at low temperatures, and create a strong bond with the substrate surface. Excessive heating of the substrate surface can result in previously coated layers being damaged. By avoiding overheating of the substrate surface, the intermittent detonation process of the present invention permits high quality coatings to be applied at high coating rates.

While particular embodiments of the present invention have been described and illustrated, it should be understood that the invention is not limited thereto since modifications may be made by persons skilled in the art. The present application contemplates any and all modifications that fall within the spirit and scope of the underlying invention disclosed and claimed herein.

What is claimed is:

1. A method for producing a coating on a substrate using a pulsed detonation gun, the method comprising:
    providing a pulsed detonation gun comprising a detonation tube having an internal diameter of less than 10 mm, an igniter, and an outlet for discharging detonation products;
    forming a detonable mixture containing at least one coating precursor in said detonation tube;
    igniting said detonable mixture to produce detonation products containing said coating precursor; and
    contacting said coating precursor with said substrate to produce a coating on said substrate.

2. The method of claim 1 wherein said at least one coating precursor comprises particles selected from the group consisting of metals, cements, ceramics, polymers, and combinations thereof.

3. The method of claim 2 wherein said particles have a mean particle size of less than about 50$\mu$.

4. The method of claim 3 wherein said mean particle size is less than about 10$\mu$.

5. The method of claim 4 wherein said mean particle size is less than about 1$\mu$.

6. The method of claim 5 wherein said mean particle size is less than about 100 nm.

7. The method of claim 6 wherein said mean particle size is less than about 10 nm.

8. The method of claim 1 wherein the diameter is less than about 5 mm.

9. The method of claim 8 wherein the diameter is less than about 2 mm.

10. The method of claim 1 wherein said steps of forming and igniting said detonable mixture are intermittently performed at a frequency of from about 0.1 to about 1,000 Hz.

11. The method of claim 1 further comprising a step of accelerating said detonation products containing said coating precursor in a low-pressure chamber having a pressure of less than 1 atmosphere.

12. A method for producing a coating on a substrate using a pulsed detonation gun in which a coating material is formed in situ from a coating precursor, the method comprising:
    providing a pulsed detonation gun comprising a detonation tube having an internal diameter of less than 10 mm, an igniter, and an outlet for discharging detonation products;
    forming a detonable or reactive mixture containing at least one coating precursor in said detonation tube;
    igniting said detonable or reactive mixture to produce high-temperature detonation or reaction products and to form said coating material; and
    contacting said coating material with said substrate to produce a coating on said substrate.

13. The method of claim 12 wherein said coating precursor comprises a gaseous or liquid metalorganic compound selected from the group consisting of silane, disilane, germane, tungsten hexaflurade, trimethylboron, cadmium acetate, magnesium ethoxide, tantalum V-methoxide, tungsten V-ethoxide, zinc naphenate, and zirconium n-butoxide.

14. The method of claim 13 where said metalorganic compound is used as fuel for detonation.

15. The method of claim 14 wherein the diameter is less than about 5 mm.

16. The method of claim 15 wherein the diameter is less than about 2 mm.

17. The method of claim 12 wherein said coating precursor comprises particles having a mean particle size of less than about 50$\mu$.

18. The method of claim 17 wherein said mean particle size is less than about 10μ.

19. The method of claim 18 wherein said mean particle size is less than about 1μ.

20. The method of claim 19 wherein said mean particle size is less than about 100 nm.

21. The method of claim 20 wherein said mean particle size is less than about 10μ.

22. The method of claim 12 wherein said steps of forming and igniting said detonable mixture are intermittently performed at a frequency of from about 0.1 to about 1,000 Hz.

23. The method of claim 12 further comprising a step of accelerating said detonation products containing said coating precursor in a low-pressure chamber having a pressure of less than 1 atmosphere.

24. A method for producing a coating on an internal surface of a tube using a pulsed detonation gun, the method comprising:
providing a pulsed detonation gun comprising a detonation chamber, an igniter, and an outlet for discharging detonation products;
forming a mixture of at least one coating precursor in fuel or oxidizer;
injecting said mixture into said detonation chamber and forming a detonable mixture;
igniting said detonable mixture to produce detonation products containing said coating precursor; and
contacting said coating precursor with said internal surface of said tube to produce a coating on said surface.

25. A pulsed detonation coating apparatus comprising a detonation tube for receiving a detonable or reactive mixture, wherein said detonation tube has an internal diameter of less than 10 mm and comprises:
at least one inlet for receiving a detonable or reactive mixture containing at least one coating precursor;
an igniter for igniting said detonable or reactive mixture to produce detonation or reaction products containing said coating precursor or a coating material produced from said coating precursor; and
an outlet for discharging said coating precursor or said coating material toward a substrate.

26. The apparatus of claim 25 wherein said igniter intermittently ignites said detonable or reactive mixture at a frequency of from about 0.1 to about 1,000 Hz.

27. The apparatus of claim 25 wherein said detonation tube has a diameter of less than about 5 mm.

28. The apparatus of claim 27 wherein the diameter is less than about 2 mm.

29. The apparatus of claim 25 further comprising a nozzle in communication with said detonation tube.

30. A pulsed detonation coating apparatus comprising a detonation tube for receiving a detonable or reactive mixture, wherein said detonation tube comprises:
at least one inlet for receiving a detonable or reactive mixture containing at least one coating precursor;
an igniter for igniting said detonable or reactive mixture to produce detonation or reaction products containing said coating precursor or a coating material produced from said coating precursor;
an outlet for discharging said coating precursor or said coating material toward a substrate; and
a nozzle in communication with said detonation tube, wherein said nozzle is flexible and is displaceable to a plurality of coating positions.

31. A pulsed detonation coating apparatus comprising a detonation tube for receiving a detonable or reactive mixture, wherein said detonation tube comprises:
at least one inlet for receiving a detonable or reactive mixture containing at least one coating precursor;
an igniter for igniting said detonable or reactive mixture to produce detonation or reaction products containing said coating precursor or a coating material produced from said coating precursor;
an outlet for discharging said coating precursor or said coating material toward a substrate; and
a nozzle in communication with said detonation tube, wherein said nozzle is fixed at a predetermined angle greater than 0° relative to the axis of the detonation tube.

32. The apparatus of claim 31 wherein the nozzle is fixed at an angle of about 45°–135° relative to the axis of the detonation tube.

33. The apparatus of claim 32 wherein the angle is about 90°.

34. A pulsed detonation coating apparatus comprising a detonation tube for receiving a detonable or reactive mixture, wherein said detonation tube comprises;
at least one inlet for receiving a detonable or reactive mixture containing at least one coating precursor;
an igniter for igniting said detonable or reactive mixture to produce detonation or reaction products containing said coating precursor or a coating material produced from said coating precursor;
an outlet for discharging said coating precursor or said coating material toward a substrate; and
a nozzle in communication with said detonation tube, wherein said nozzle is configured as a showerhead having a plurality of small openings for directing the coating material toward a substrate to be coated.

35. The apparatus of claim 34 wherein said igniter intermittently ignites said detonable mixture at a frequency of from about 0.1 to about 1,000 Hz.

36. The apparatus of claim 34 wherein said detonation tube has a diameter of less than about 5 mm.

37. The apparatus of claim 36 wherein the diameter is less than about 2 mm.

38. A pulsed detonation coating apparatus comprising:
a detonation tube for receiving a detonable or reactive mixture, wherein said detonation tube has an internal diameter of less than 10 mm and comprises at least one inlet for receiving a detonable or reactive mixture containing at least one coating precursor, an igniter for igniting said detonable or reactive mixture to produce detonation or reaction products containing said coating precursor or a coating material produced from said coating precursor, and an outlet for discharging coating material toward a substrate;
a low-pressure chamber for accelerating said detonation or reaction products discharged from said outlet; and
low-pressure means for maintaining a pressure of less than 1 atmosphere in said low-pressure chamber.

39. The apparatus of claim 38 wherein said low-pressure means maintains a pressure not exceeding about $10^{-1}$ atmospheres in said low-pressure chamber.

40. The apparatus of claim 39 wherein said low-pressure means maintains a pressure not exceeding about $10^{-3}$ atmospheres in said low-pressure chamber.

41. The apparatus of claim 38 further comprising a nozzle in communication with said detonation tube outlet.

42. The apparatus of claim 41, wherein said nozzle is flexible and is displaceable to a plurality of coating positions.

43. The apparatus of claim 41, wherein said nozzle is fixed at a predetermined angle relative to the axis of the detonation tube.

44. The apparatus of claim 41, wherein said nozzle is configured as a showerhead having a plurality of small openings for directing the coating material toward a substrate to be coated.

45. A pulsed detonation coating apparatus comprising a detonation tube for receiving a detonable or reactive mixture, wherein said detonation tube comprises:

at least one inlet for receiving a detonable or reactive mixture containing at least one coating precursor;

an igniter for igniting said detonable or reactive mixture to produce detonation or reaction products containing said coating precursor or a coating material produced from said coating precursor;

an outlet for discharging said coating precursor or said coating material toward a substrate; and a nozzle in communication with said detonation tube;

wherein the total length of the coating apparatus is about 500 mm or less.

46. The apparatus of claim 45 wherein the total length is about 50 mm or less.

* * * * *

UNITED STATES PATENT AND TRADEMARK OFFICE
CERTIFICATE OF CORRECTION

PATENT NO. : 6,787,194 B2 Page 1 of 1
APPLICATION NO. : 10/123522
DATED : September 7, 2004
INVENTOR(S) : Shmuel Eidelman It is certified that error appears in the above-identified patent and that said Letters Patent is hereby corrected as shown below:

In Column 11, Claim 21, Line 8:
    Please replace "10μ" with --10nm--

In Column 11, Claim 24, Line 21:
    Please replace "mixture of at least" with --suspension of particles of at least--

In Column 11, Claim 24, Line 23:
    Please replace "mixture" with --suspension--

In Column 11, Claim 31, Line 67:
    Please replace "tube comprises" with --tube has an internal diameter of less than 10 mm and comprises--

In Column 13, Claim 45, Line 13:
    Please replace "tube comprises" with --tube has an internal diameter of less than 10 mm and comprises--

Signed and Sealed this

Fifteenth Day of January, 2008

JON W. DUDAS
*Director of the United States Patent and Trademark Office*